(12) United States Patent
Wieczorek et al.

(10) Patent No.: US 7,148,145 B2
(45) Date of Patent: *Dec. 12, 2006

(54) SEMICONDUCTOR DEVICE HAVING T-SHAPED GATE STRUCTURE COMPRISING IN SITU SIDEWALL SPACERS AND METHOD OF FORMING THE SEMICONDUCTOR DEVICE

(75) Inventors: Karsten Wieczorek, Dresden (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 260 days.

This patent is subject to a terminal disclaimer.

(21) Appl. No.: 10/400,598

(22) Filed: Mar. 27, 2003

(65) Prior Publication Data

US 2004/0048472 A1    Mar. 11, 2004

(30) Foreign Application Priority Data

Sep. 6, 2002    (DE)    ................. 102 41 397

(51) Int. Cl.
*H01L 21/302*    (2006.01)
(52) U.S. Cl. ...................... 438/692; 438/574
(58) Field of Classification Search ........ 438/182–184, 438/574, 592, 692, 733–734
See application file for complete search history.

(56) References Cited

U.S. PATENT DOCUMENTS

| | | | | |
|---|---|---|---|---|
| 5,998,285 A * | 12/1999 | Chou | .......................... | 438/585 |
| 6,057,576 A | 5/2000 | Hsia et al. | .................. | 257/344 |
| 6,284,613 B1 | 9/2001 | Subrahmanyam | ........... | 438/307 |
| 6,395,606 B1 * | 5/2002 | Huster et al. | ............... | 438/289 |
| 6,593,618 B1 * | 7/2003 | Kamata et al. | ............. | 257/327 |

FOREIGN PATENT DOCUMENTS

EP    0 991 113 A2    4/2000

OTHER PUBLICATIONS

Wolf et al., Silicon Processing for the VLSI Era, 1986, Lattice Press, vol. 1, pp. 124, 175, 182-183, 384-386, 389-390, 398-399, 407-408.*

* cited by examiner

*Primary Examiner*—Kin-Chan Chen
(74) *Attorney, Agent, or Firm*—Williams, Morgan & Amerson, P.C.

(57) ABSTRACT

Polysilicon lines are formed, featuring an upper portion extending beyond the lower portion that defines the required CD. Accordingly, metal silicide layers of increased dimensions can be formed on the upper portion of the polysilicon lines so that the resulting gate structures exhibit a very low final sheet resistance. Moreover, in situ sidewall spacers are realized during the process for forming the polysilicon lines and without additional steps and/or costs.

29 Claims, 4 Drawing Sheets

SEMICONDUCTOR DEVICE HAVING T-SHAPED GATE STRUCTURE COMPRISING IN SITU SIDEWALL SPACERS AND METHOD OF FORMING THE SEMICONDUCTOR DEVICE

BACKGROUND OF THE INVENTION

1. Field of the Invention

The present invention relates to the field of fabrication of integrated circuits, and, more particularly, to a semiconductor device such as a field effect transistor having a gate electrode structure with a metal silicide layer formed thereon.

2. Description of the Related Art

Generally, a silicon-based field effect transistor comprises highly doped silicon regions, also referred to as drain and source regions, that are embedded in a lightly and inversely doped silicon region, a so-called N-well or P-well, depending on the type of transistor. The drain and the source regions are spaced apart by a channel region interposed in between, wherein a conductive channel forms between the drain and source regions in the channel region upon application of an appropriate voltage to a gate electrode that is usually formed over the channel region and is separated therefrom by a gate insulation layer, often provided as a gate oxide layer.

Thus, in the most common field effect transistors, the gate electrode structure essentially comprises the gate electrode formed above the gate insulation layer, with polysilicon often being selected as the material for forming the gate electrode for several reasons.

For instance, polysilicon exhibits high compatibility with the subsequent high temperature processes that will be performed in completing the manufacture of the integrated circuit device. Moreover, the polysilicon interface with thermal silicon dioxide is well understood and electrically stable. Furthermore, polysilicon is more reliable than, for example, aluminum gate materials and can be deposited conformally over a step-like topography. However, problems arise when polysilicon is used as a gate electrode material due to its higher electric resistance compared to metals, such as aluminum.

Even when doped at the highest practical concentration, a 0.5 μm thick polysilicon film has a sheet resistance of about 20Ω sq. compared to 0.05Ω sq. for a 0.5 μm thick aluminum film. The resulting high values of interconnect line resistance can therefore lead to relatively long RC time constants (i.e., long propagation delays) and DC voltage variations within VLSI (very large scale integration) circuits.

To overcome this drawback, several solutions have been proposed and developed in the art. Among these solutions, the formation of metal silicides on the top of the polysilicon gate structure has proven to be the most reliable one for obtaining the lowest resistance values.

A typical prior art method of forming metal silicides on silicon-containing regions, such as the gate electrode of a MOS transistor, will be described in the following with reference to FIGS. 1a–1d.

FIG. 1a schematically shows a MOS transistor 100 to be formed on a substrate 1, such as a silicon wafer. Isolation structures 2 define an active region of the transistor 100. Moreover, reference 3 relates to a polysilicon gate electrode of the MOS transistor 100. Reference 4 relates to oxide side spacers formed on the sidewalls of the polysilicon gate electrode 3. Reference 6 denotes a gate insulation layer and reference 5 relates to the source and drain regions of the MOS transistor 100.

FIG. 1b shows the MOS transistor 100 with a refractory metal layer 7 deposited thereon. In FIG. 1c, reference 8 relates to metal suicide layers formed on top of the polysilicon gate electrode 3 and on the source and drain regions 5.

Starting with the MOS transistor as depicted in FIG. 1a, in a first step, the refractory metal layer 7 is deposited on the MOS transistor 100, as depicted in FIG. 1b. Usually, either titanium or cobalt is used as a metal for forming the metal layer 7, and typically a physical vapor deposition (PVD) process, e.g., a sputtering process, is carried out for depositing the refractory metal layer 7.

Once the refractory metal layer 7 has been deposited, a low temperature thermal step (approximately 450° for cobalt or 650° for titanium) is carried out to react the metal in contact with silicon on the source/drain regions 5 and the polysilicon gate electrode 3. During the thermal step, interdiffusion of the polysilicon and metal occurs at the polysilicon/metal interface on top of the polysilicon gate electrode 3 as well as on the source/drain regions 5. As a result, the metal silicide layers 8 are formed, as depicted in FIG. 1c, whereby the refractory metal layer 7 is at least partially consumed.

In a subsequent step, as depicted in FIG. 1d, the non-reacted metal is selectively removed with a selective wet-etching step, leaving behind the metal silicide layers 8 on top of the silicon gate electrode 3 and on the source/drain regions 5.

Commonly, a further heat treatment (not depicted in the figures) is carried out at a higher temperature than the previous heat treatment to transform the metal silicide layers 8 into a more stable phase that exhibits a lower resistance than the metal suicide layers formed during the previous lower temperature heat treatment. For example, if cobalt is used, a cobalt mono-silicide is formed during the first heat treatment, which is then converted into a cobalt disilicide.

Since the finally-obtained metal silicide layers 8 exhibit a sheet resistance that is much lower as compared to the sheet resistance of polysilicon, the total resistance of the gate electrode 3, including the metal silicide layers 8, is decreased.

The prior art method described above has accomplished satisfactory results for devices having minimum feature sizes of 0.5 μm and more. The above method, however, is not completely adequate to compensate for the increase of the polysilicon sheet resistance, which arises in case of deep-sub-micron devices, i.e., with feature sizes equal to or smaller than 0.25 μm.

The reasons for this can be explained as follows. As a general rule, decreasing the transistor size, i.e., the channel length, that is, in FIGS. 1a–1d, the horizontal distance between the source/drain regions 5, requires reducing the thickness of the gate insulation layer 6 and necessitates shallower source/drain regions which, in turn, restrict the achievable thickness of the metal silicides 8. As the metal silicide layer 8 for the gate electrode 3 is simultaneously formed with the metal silicide layers 8 of the drain and source regions 5, the thickness and, thus, the reduction in resistance, of the gate silicides is also restricted.

As the cross-sectional dimensions of the polysilicon gate electrode 3 decrease as a result of the continuous miniaturization of the devices, the resistance of the polysilicon portions of the gate structures increases and represents the dominant contribution of the resistance of the polysilicon gate electrode 3. The final resistance of the gate electrode is, therefore, only scarcely influenced by the silicide layer, but practically corresponds to the resistance of the polysilicon portion of the gate structure.

Since the trend toward an increasing miniaturization of the devices manufacturable on a substrate will continue in years to come, it clearly results that the formation of metal silicide layers on the top of gate polysilicon lines according to the prior art methods will render it very difficult to realize gate structures featuring resistances in conformity with the electrical performance required.

Accordingly, in view of the problems explained above, it would be desirable to provide a technique that may solve or reduce one or more of the problems identified above.

SUMMARY OF THE INVENTION

In general, the present invention is based on the consideration that gate structures featuring a low sheet resistance can be realized by "decoupling" the effective gate length from the gate resistance in that the cross-sectional area of polysilicon lines is increased in an upper portion that is at least partially silicided, while the required bottom-CD (bottom critical dimension) of the lines is maintained.

According to one embodiment, the present invention relates to a method of forming at least one feature on a substrate comprising forming at least one initial feature of a semiconductive material above the substrate, wherein the initial feature has sidewalls and an upper surface. The method further comprises forming a dielectric layer on the substrate adjacent to a portion of the sidewalls, wherein the dielectric layer covers less than all of the sidewalls and defines an exposed portion of the sidewalls of the initial feature, and forming a layer of a semiconductive material on at least the upper surface and the exposed portion of the sidewalls of the initial feature so as to form at least one intermediate feature of a semiconductive material having an upper portion extending beyond the sidewalls of the initial feature and covering a portion of the dielectric layer adjacent to the sidewalls. Finally, the method comprises removing the dielectric layer not covered by the upper portion of the intermediate feature.

According to another embodiment, the present invention relates to a method of forming at least one conductive silicon-containing feature on a substrate, the method comprising forming at least one initial silicon-containing feature above the substrate, wherein the initial feature has sidewalls and an upper surface, and forming a dielectric layer on the substrate adjacent to a portion of the sidewalls, wherein the dielectric layer covers less than all of the sidewalls and defines an exposed portion of the sidewalls of the initial feature. The method further comprises forming a silicon-containing layer on at least the upper surface and the exposed portion of the sidewalls of the initial feature so as to form at least one intermediate silicon-containing feature having an upper portion extending laterally beyond the sidewalls of the initial feature and covering a portion of the dielectric layer adjacent to the sidewalls. Moreover, the method comprises removing the dielectric layer not covered by the upper portion of the intermediate feature and forming a metal silicide layer on the upper portion of the intermediate feature.

According to a further embodiment of the present invention, there is provided a method of forming the gate electrode of at least one field effect transistor to be formed on a substrate, the method comprising forming at least one initial polysilicon line above an active region of the transistor and forming a dielectric layer on the lower portion of the sidewalls of the initial polysilicon line by depositing a layer of a dielectric material on the upper surface and the sidewalls of the initial polysilicon line and partially removing the dielectric material to expose the upper surface and the upper portion of the sidewalls of the initial polysilicon line. Moreover, the method comprises forming a polysilicon layer on at least the upper surface and the exposed portion of the sidewalls of the initial polysilicon line so as to define at least one intermediate polysilicon line having an upper portion extending beyond the initial polysilicon line and covering a portion of the dielectric layer and removing the dielectric layer not covered by the upper portion of the intermediate polysilicon line so as to form in situ dielectric sidewall spacers of the gate electrode. Finally, the method comprises forming at least a metal silicide layer on at least the upper portion of the intermediate polysilicon line.

In still another embodiment of the present invention, there is provided a field effect transistor comprising at least one silicon-containing gate electrode having an upper portion and a lower portion, the upper portion extending beyond the lower portion. Moreover, the field effect transistor comprises dielectric sidewall spacers covered by the upper portion of the electrode and a metal silicide layer covering at least the upper surface of the upper portion.

BRIEF DESCRIPTION OF THE DRAWINGS

The invention may be understood by reference to the following description taken in conjunction with the accompanying drawings, in which like reference numerals identify like elements, and in which.

Figure 1A:
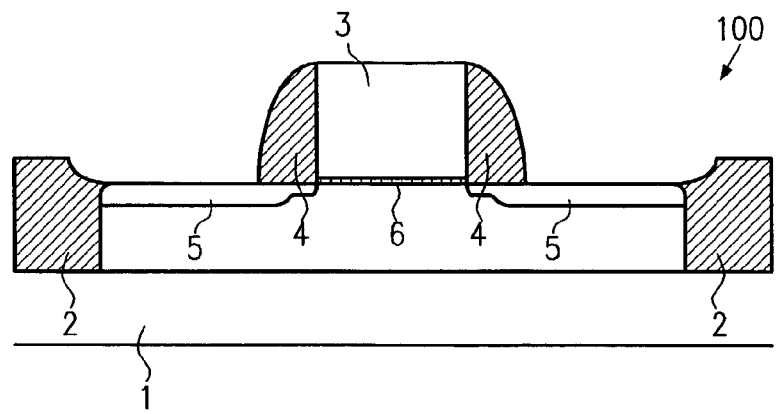
FIGS. 1a–1d represent a typical process sequence of a prior art method of forming metal suicides.
Figure 1B:
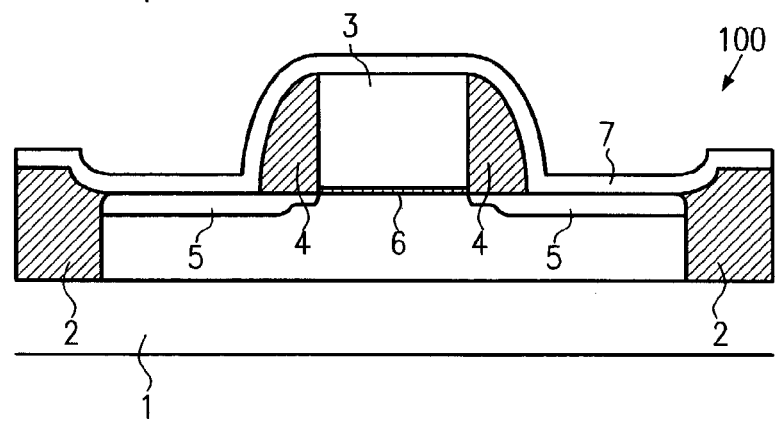
Figure 1C:
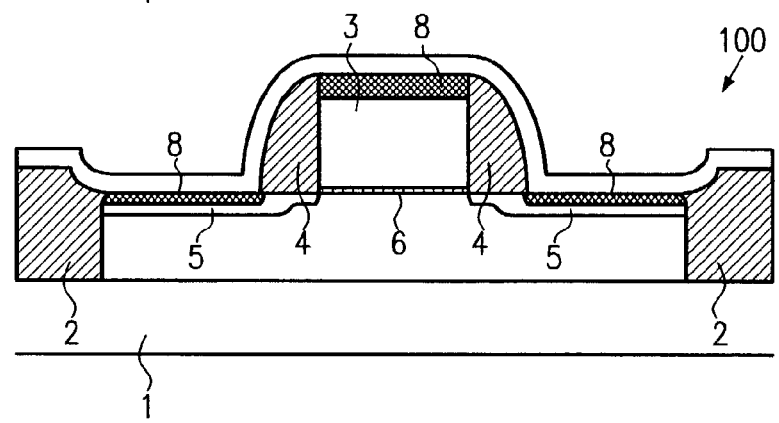
Figure 1D:
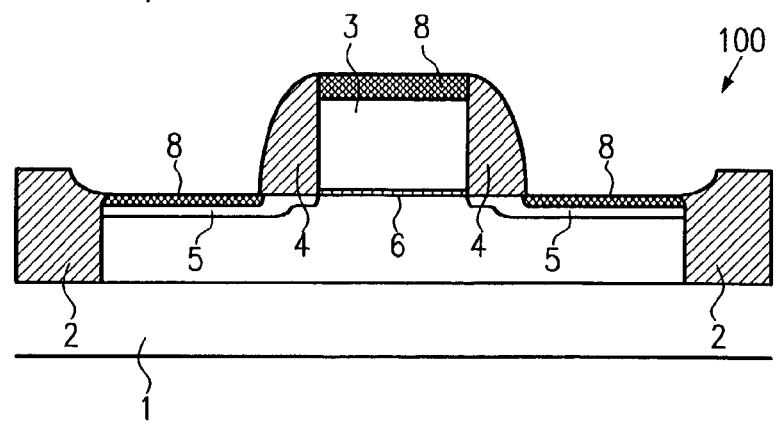

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is understood to be of particular advantage when used for forming the gate structures of MOS transistors. For this reason, examples will be given in the following in which corresponding embodiments of the present invention are related to the formation of the gate structures of a MOS transistor. However, it has to be noted that the present invention is not limited to the formation of gate structures of MOS transistors but can be used in any other situation in which the realization of semiconductive lines exhibiting low sheet resistance is required. The present invention is, therefore, also applicable to these semiconductive lines, and the gate structures described in the following illustrative embodiments are to represent any semiconductive line, irrespective of the crystalline structure and the degree and type of dotation.

Figure 2A:
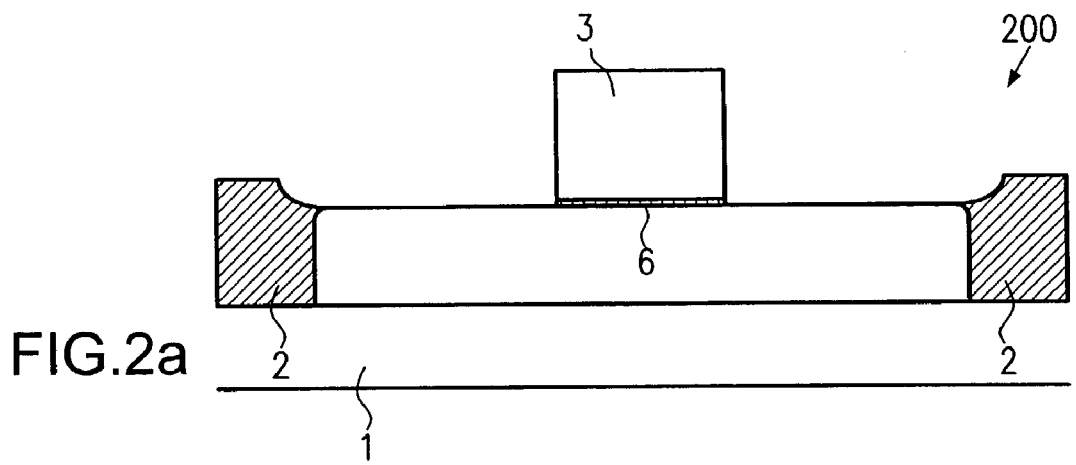
FIGS. 2a–2f represent a process sequence for forming gate structures according to one illustrative embodiment of the present invention.

With reference to FIGS. 2a–2f, illustrative embodiments of the present invention will now be described. In FIG. 2a, reference 1 relates to a substrate of a MOS transistor 200 to be formed, for instance a silicon wafer. Reference 2 relates to isolation structures defining an active region. The isolation structures 2 are provided as shallow trench isolation (STI) structures. However, other isolation structures, for instance local oxidation of silicon (LOCOS) structures, could have been formed instead of STI structures. The isolation structures 2 essentially comprise an insulating material, such as silicon dioxide, silicon nitride or the like. References 3 relates to a polysilicon gate electrode (in the following also referred to as gate polysilicon lines) formed on a gate insulation layer 6 formed on the active region of the substrate 1.

Figure 2B:
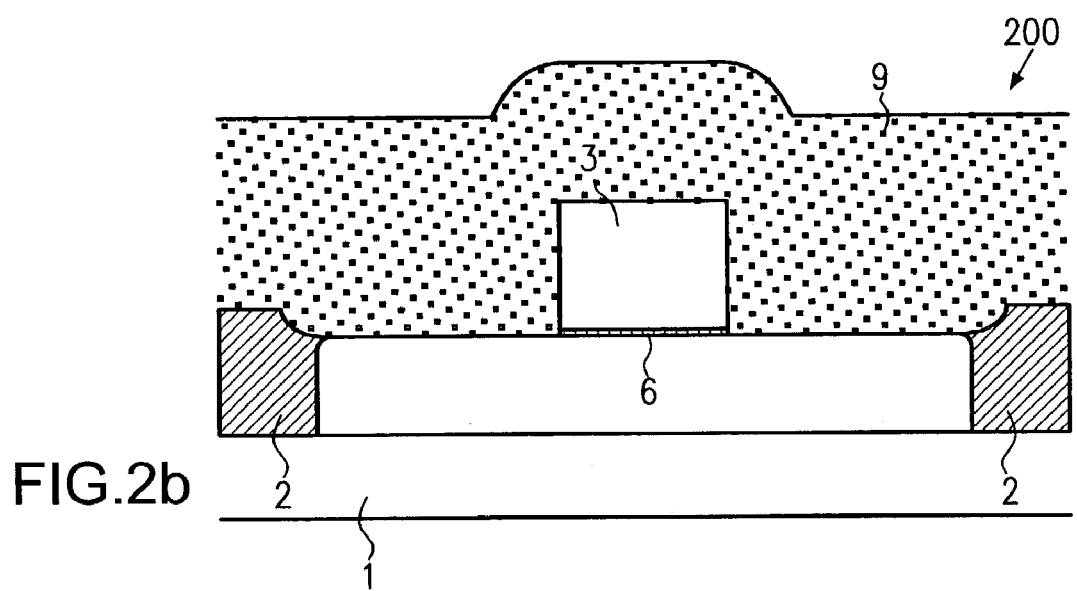
Figure 2C:
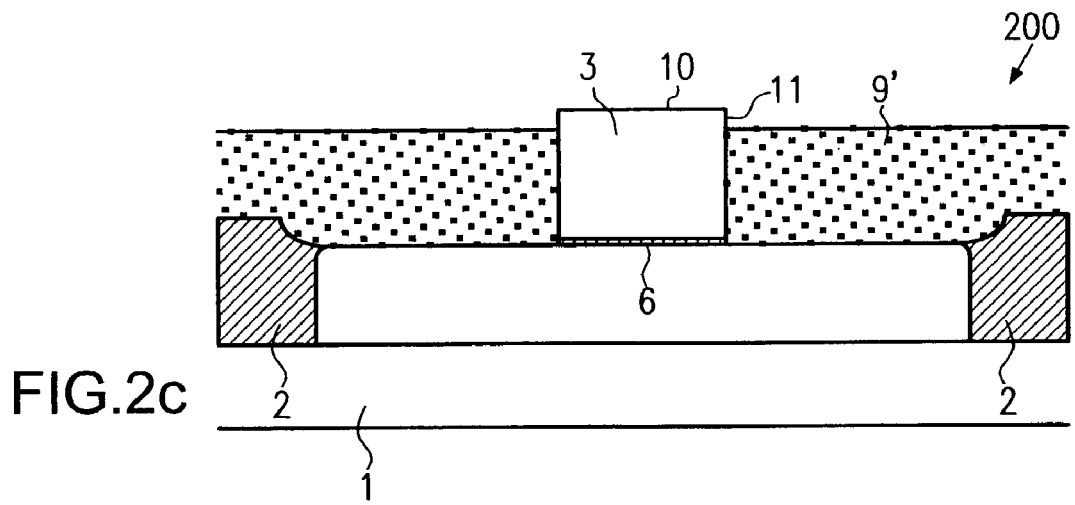
Figure 2D:
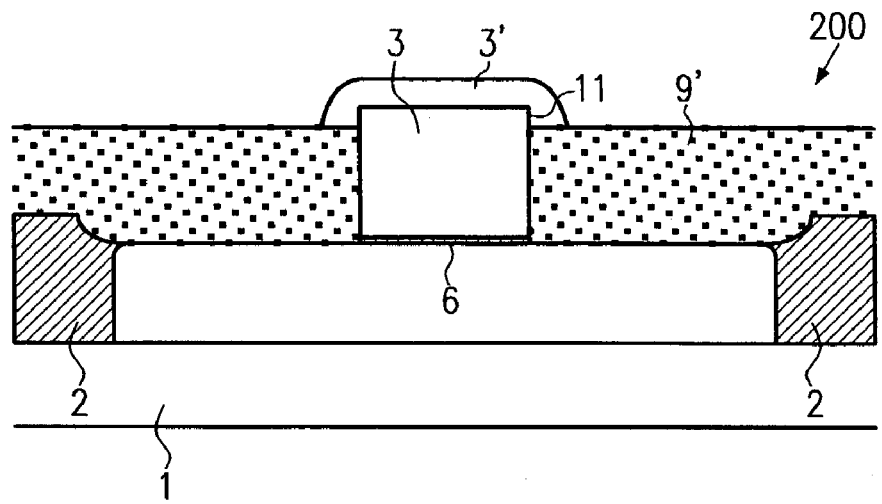
Figure 2E:
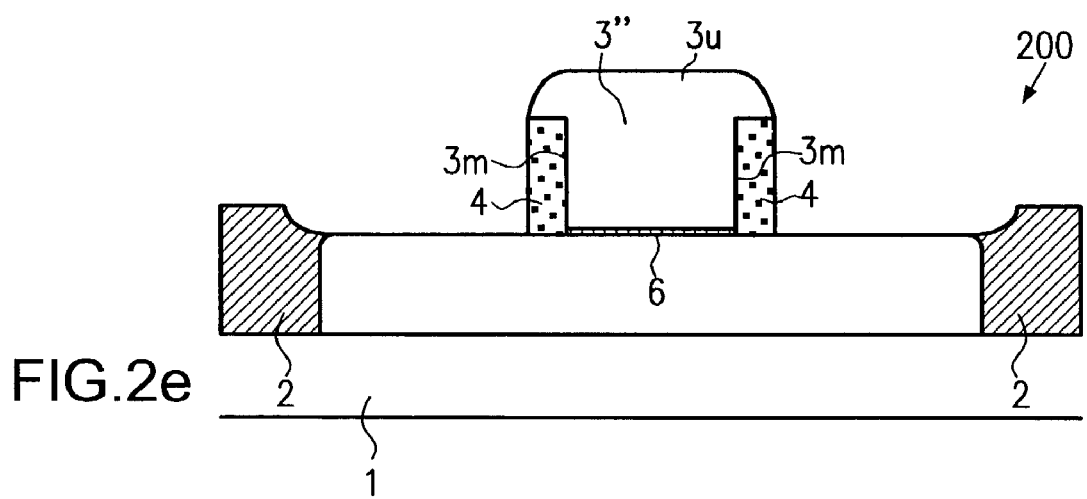

In FIG. 2b, reference 9 relates to a dielectric layer formed on the substrate 1. In FIG. 2c, the dielectric layer 9 is partially removed to form a layer 9'. In FIG. 2d, reference 3' denotes a polysilicon cap layer formed on the polysilicon line 3. In FIG. 2e, reference 3" relates to a polysilicon line having an upper portion 3u extending beyond sidewalls 3m. Moreover, reference 4 denotes in situ sidewall spacers formed on the sidewalls 3m of the polysilicon line 3".

A typical process flow for forming the MOS transistor 200 in accordance with illustrative embodiments of the present invention may include the following steps. Starting from FIG. 2a, the layer 9 of dielectric material is formed on the substrate 1 (FIG. 2b). For example, a layer of silicon oxide can be deposited according to a low pressure chemical vapor deposition (LPCVD) technique. Alternatively, a layer of silicon nitride or any other dielectric material can be formed on the substrate 1 according to any known technique. The layer 9 is blanket-deposited to a thickness that exceeds the height of the polysilicon line 3 so that the polysilicon line 3 is completely covered by the dielectric layer 9.

Subsequently, the dielectric layer 9 is partially removed, as depicted in FIG. 2c. This step aims to expose an upper surface 10 and, at least partially, upper portions 11 of the sidewalls of the polysilicon line 3. To this end, a first polishing step, for instance a chemical mechanical polishing step, is carried out until the upper surface 10 of the polysilicon lines 3 is exposed. Subsequently, the dielectric layer 9 is etched back anisotropically in order to reliably expose at least the portion 11 of the sidewalls of the polysilicon lines 3, thereby forming the dielectric layer 9'. Thus, the upper surface 10 of the polysilicon line 3 and at least the upper portions 11 of the sidewalls of the polysilicon line 3 are substantially completely exposed.

As shown in FIG. 2d, the polysilicon cap layer 3' is formed on the polysilicon line 3, for instance, by selective epitaxial growth. Since the upper surface 10 of the polysilicon line 3 and at least the upper portion 11 of the sidewalls of the polysilicon line 3 are substantially completely exposed, the growth of polysilicon will occur in both vertical and lateral directions, i.e., on both the upper surface 10 and the exposed portion 11 of the sidewalls of the polysilicon line 3, to form the cap layer 3' covering the upper surface 10 and the exposed portion 11 of the sidewalls of the polysilicon line 3. Once the polysilicon cap layer 3' has been formed on the polysilicon line 3, as described above, the dielectric layer 9' is anisotropically etched.

FIG. 2e shows the MOS transistor 200 after removing the dielectric layer 9' except for those portions of the dielectric layer 9' that are masked by the cap layer 3'. Dielectric material is left covering the sidewalls 3m of the polysilicon line 3, thereby forming the in situ dielectric sidewall spacers 4 on the sidewalls 3m of the polysilicon line 3.

As shown in FIG. 2e, the polysilicon line 3" formed on the gate dielectric layer 6 comprises a central portion defined by the sidewalls 3m and an upper portion 3u extending laterally beyond the sidewalls 3m. The polysilicon line 3" represent a T-shaped line having an increased cross-sectional area compared to a conventional polysilicon line. Thus, the polysilicon line 3" formed according to the present invention has a desired small bottom-CD (bottom critical dimension), while at the same time providing an increased cross-sectional area and, thus, a reduced resistance. Therefore, metal silicide layers of increased dimension can be formed on the polysilicon lines 3". The enlarged upper portion 3u of the polysilicon line 3" allows enlarged metal layers to be deposited on the upper portion 3u. Accordingly, the final sheet resistance of the polysilicon line 3" is strongly influenced by the metal silicide layer 8, so that the resistance thereof is substantially determined by the metal silicide layer 8 substantially without being limited by the bottom-CD. Accordingly, polysilicon lines can be formed, exhibiting on the one hand a reduced sheet resistance but, on the other hand, still accomplishing the dimensional requirements arising from the decreasing miniaturization of the devices manufacturable on a substrate.

Once the polysilicon line 3" of FIG. 2e is formed, the MOS transistor 200 is completed on the substrate I according to well-known techniques, for example by forming lightly doped regions on the exposed portions of the substrate 1. During the implantation step for forming the lightly doped regions (not depicted in FIG. 2f), an angle of incidence may be varied to allow dopants to be implanted in those regions of the substrate shielded and/or shaded by the protruding upper portion of the polysilicon line 3″ and the sidewall spacers 4.

Figure 2F:
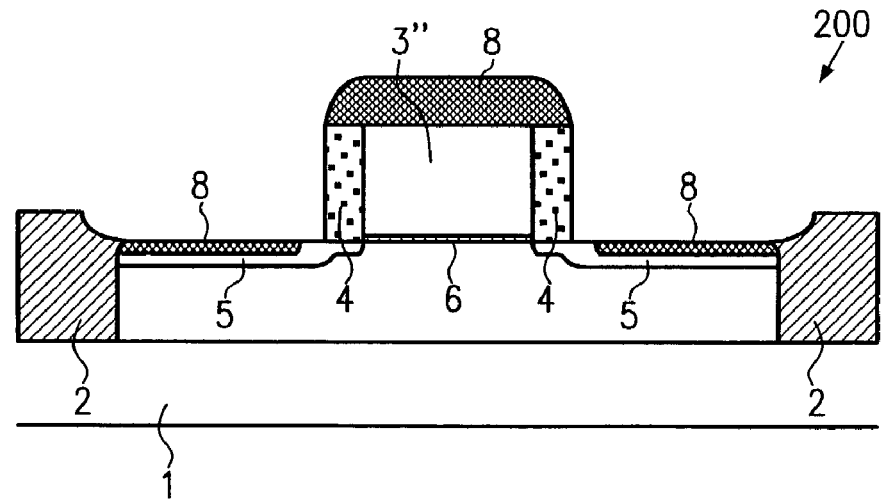

After the light ion implantation step, a further heavy ion implantation step follows, allowing formation of the source/drain regions 5, as depicted in FIG. 2f. Finally, the metal silicide layers 8 are formed on the polysilicon line 3″, as well as on the source and drain regions 5. As stated above, due to the T-shaped cross-sectional shape of the polysilicon line 3″, the MOS transistor 200 has a gate electrode exhibiting a final sheet resistance that is lower as compared to the sheet resistance of gate structures formed according to prior art methods.

Figure 3A:
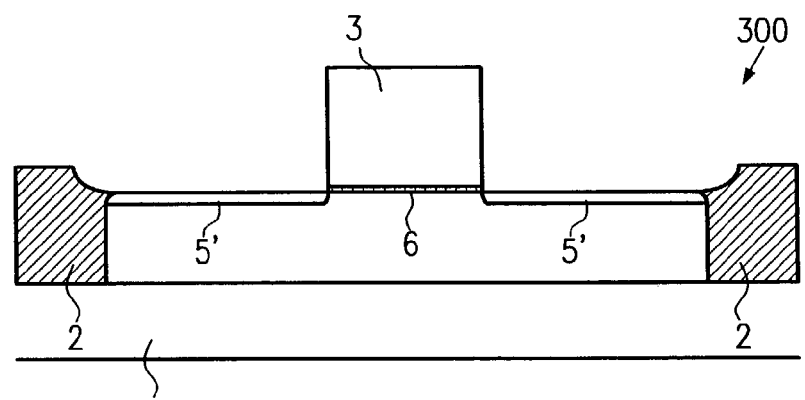
FIGS. 3a–3d represent an example for modifying the process sequence depicted in FIGS. 2a–2f according to another embodiment of the present invention.
Figure 3B:
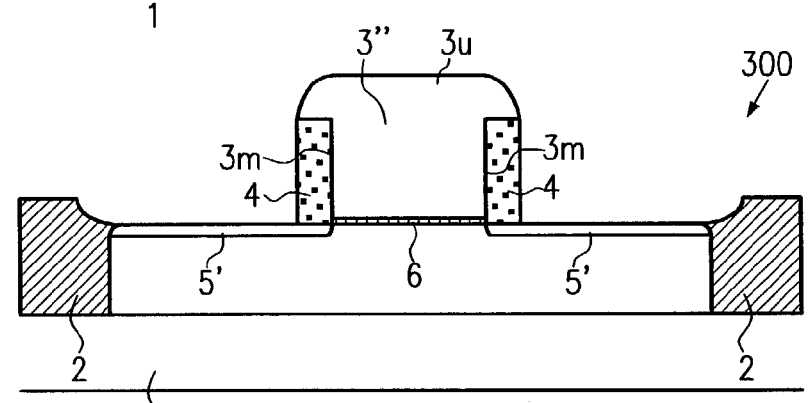

According to a further embodiment, the sequence described above may be modified as will be described with reference to FIGS. 3a–3d. In FIG. 3a, the light implantation step for forming a lightly doped region can be carried out prior to the formation of the polysilicon line 3″ having the enlarged upper portion 3u. Once the gate dielectric layer 6 and the overlying initial polysilicon line 3 have been formed according to well-known methods, including deposition of a polysilicon layer, DUV-lithography, resist-trim, anisotropic etching, etc., a light ion implantation step can be performed for the purpose of forming lightly doped regions 5' on those regions of the substrate 1 where the source and drain regions 5 will be formed. Forming the lightly doped regions 5' at this moment during the manufacturing process, i.e., after the formation of the initial polysilicon line 3, has the advantage that dopants can be easily implanted into the regions of the substrate 1 adjacent to the gate dielectric layer 6.

Figure 3C:
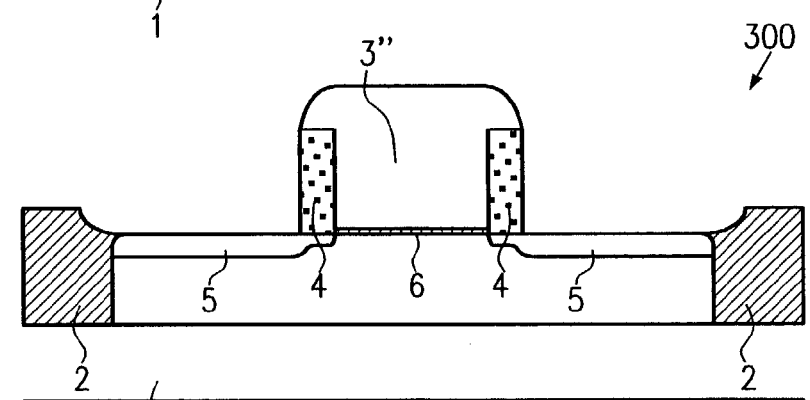
Figure 3D:
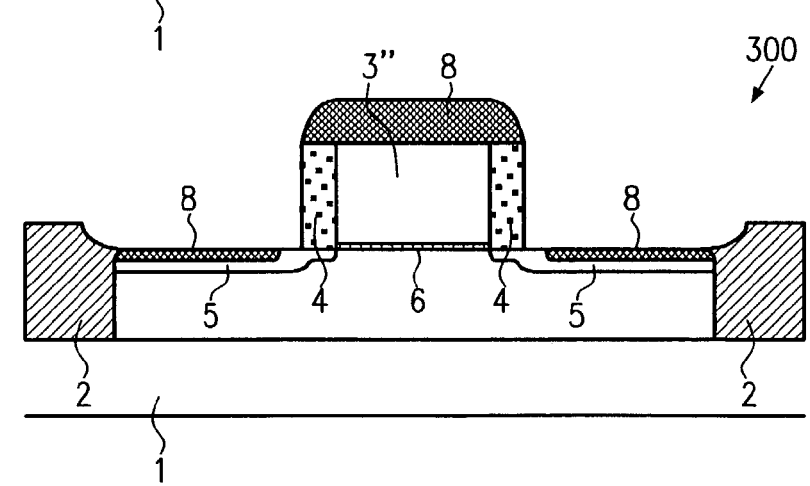

The sequence is then continued with forming the final polysilicon line 3″ and the sidewall spacers 4 according to the process flow described above with reference to FIGS. 2a–2f. As shown in FIG. 3c, after forming the final polysilicon line 3″, the sequence is resumed by forming the sidewall spacers 4. Subsequently, as depicted in FIG. 3d, a heavy ion implantation step is carried out, resulting in the formation of the source and drain regions 5 depicted in FIG. 3d. The transistor is then completed by forming the metal silicide layers (not depicted in FIGS. 3a–3d).

In conclusion, the present invention allows realizing polysilicon lines featuring a required small bottom-CD and an increased cross-sectional area, thereby allowing a significantly larger portion of the polysilicon to be converted in a highly conductive metal silicide layer. Thus, scalable gate electrodes may be provided with a process flow that is highly compatible with conventional CMOS processing. Moreover, forming in situ sidewall spacers according to the present invention allows one to avoid those steps usually required for forming sidewall spacers according to prior art methods.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming at least one feature on a substrate, said method comprising:

forming at least one initial feature of a semiconductive material above said substrate, said at least one initial feature having sidewalls and an upper surface;

forming a dielectric layer on said substrate adjacent a portion of said sidewalls, said dielectric layer covering less than all of said sidewalls and defining an exposed portion of said sidewalls of said at least one initial feature, wherein forming said dielectric layer on said substrate comprises:

blanket-depositing a dielectric material on said substrate so as to cover all of the sidewalls and the upper surface of said at least one initial feature;

polishing said dielectric material so as to expose the upper surface of said at least one initial feature; and partially removing the remaining dielectric layer so as to expose a portion of the sidewalls of said at least one initial feature;

selectively growing a layer of a semiconductive material on at least the upper surface and the exposed portion of the sidewalls of said at least one initial feature so as to form at least one intermediate feature of a semiconductive material having an upper portion extending beyond the sidewalls of said initial feature and covering a portion of said dielectric layer adjacent said sidewalls; and removing the dielectric layer not covered by said upper portion of said at least one intermediate feature.

2. The method of claim 1, wherein partially removing the remaining dielectric layer comprises anisotropically etching the remaining dielectric layer.

3. The method of claim 1, wherein forming said at least one initial feature comprises depositing a layer of a semiconductive material on said substrate and patterning said layer of a semiconductive material so as to form said at least one initial feature.

4. The method of claim 3, wherein patterning said layer of a semiconductive material comprises:

depositing a resist layer on said layer of a semiconductive material;

patterning said resist layer so as to expose predefined portions of said layer of a semiconductive material; and removing the exposed portions of said layer of a semiconductive material.

5. The method of claim 4, wherein removing the exposed portions of said layer of a semiconductive material comprises performing at least one of a dry-etching process and a wet-etching process.

6. The method of claim 1, wherein removing the dielectric layer not covered by said upper portion of said at least one intermediate feature comprises anisotropically dry-etching said dielectric layer according to a high-selectivity etching step.

7. The method of claim 1, wherein said semiconductive material of said at least one initial feature comprises silicon.

8. The method of claim 7, wherein said semiconductive material of said layer formed on said at least one initial feature comprises silicon.

9. The method of claim 1, wherein the semiconductive material of said at least one initial feature and said layer formed thereon comprises polysilicon.

10. The method of claim 1, wherein said dielectric layer comprises silicon oxide.

11. The method of claim 1, wherein said dielectric layer defines an exposed portion on both sidewalls of said at least one initial feature and said intermediate feature has a substantially T-shaped cross-sectional shape.

12. A method of forming at least one conductive silicon-containing feature on a substrate, said method comprising:
   forming at least one initial silicon-containing feature above said substrate, said at least one initial feature having sidewalls and an upper surface;
   forming a dielectric layer on said substrate adjacent a portion of said sidewalls, said dielectric layer covering less than all of said sidewalls and defining an exposed portion of said sidewalls of said at least one initial feature, wherein forming said dielectric layer on said substrate comprises:
      blanket-depositing a dielectric material on said substrate so as to cover all sidewalls and the upper surface of said at least one initial feature;
      polishing the dielectric material so as to expose the upper surface of said at least one initial feature; and
      partially removing the remaining dielectric layer so as to expose a portion of the sidewalls of said at least one initial feature;
   selectively growing a silicon-containing layer on at least the upper surface and the exposed portion of the sidewalls of said at least one initial feature so as to form at least one intermediate silicon-containing feature having an upper portion extending beyond the sidewalls of the initial feature and covering a portion of said dielectric layer adjacent said sidewalls;
   removing the dielectric layer not covered by said upper portion of said at least one intermediate feature; and
   forming a metal suicide layer on the upper portion of said at least one intermediate feature.

13. The method of claim 12, wherein partially removing the remaining dielectric layer comprises anisotropically etching the remaining dielectric layer.

14. The method of claim 12, wherein forming said at least one initial feature comprises depositing at least one silicon-containing layer on said substrate and patterning said silicon-containing layer so as to form said initial feature.

15. The method of claim 12, wherein removing the dielectric layer not covered by said upper portion of said at least one intermediate feature comprises anisotropically dry-etching said dielectric layer according to a high-selectivity etching step.

16. The method of claim 12, wherein forming said metal silicide layer comprises forming at least one metal layer on the upper portion of said at least one intermediate feature and reacting at least partially the silicon of said at least one intermediate feature and the metal at the intermediate feature metal interface into metal silicide by a thermal treatment.

17. The method of claim 16, wherein forming at least one metal layer comprises depositing said metal layer according to a sputtering process.

18. The method of claim 17, further comprising removing non-reacted metal after the thermal treatment by a selective wet-etching step.

19. The method of claim 12, wherein said at least one initial feature and said silicon-containing layer formed thereon contain polysilicon.

20. The method of claim 12, wherein said dielectric layer comprises at least one of silicon oxide and silicon nitride.

21. The method of claim 12, wherein said at least one metal silicide layer comprises at least one of titanium, cobalt, tantalum, zirconium, tungsten, nickel and a combination thereof.

22. A method of forming the gate electrode of at least one field effect transistor to be formed on a substrate, the method comprising:
   forming at least one initial polysilicon line above an active region of said at least one transistor;
   forming a dielectric layer on a lower portion of the sidewalls of said at least one initial polysilicon line by depositing a layer of a dielectric material on the upper surface and the sidewalls of said at least one initial polysilicon line and partially removing the dielectric material to expose the upper surface and the upper portion of the sidewalls of said at least one initial polysilicon line, wherein forming said dielectric layer comprises:
      blanket-depositing a dielectric material on said substrate so as to cover all sidewalls and the upper surface of said at least one initial polysilicon line;
      polishing the blanket-deposited dielectric layer so as to expose the upper surface of said initial polysilicon line; and
      partially anisotropically etching the remaining dielectric layer so as to expose the upper portion of the sidewalls of said at least one initial polysilicon line;
   selectively growing a polysilicon layer on at least the upper surface and the exposed portion of the sidewalls of said at least one initial polysilicon line so as to define at least one intermediate polysilicon line having an upper portion extending beyond said initial polysilicon line and covering a portion of said dielectric layer;
   removing the dielectric layer not covered by said upper portion of said at least one intermediate polysilicon line so as to form in situ dielectric sidewall spacers of said gate electrode; and
   forming at least a metal silicide layer on at least the upper portion of said at least one polysilicon line.

23. The method of claim 22, wherein forming said at least one initial polysilicon line comprises depositing a polysilicon layer on said substrate and patterning said polysilicon layer so as to form said initial polysilicon line.

24. The method of claim 22, wherein removing the dielectric layer not covered by said upper portion of said at least one intermediate polysilicon line comprises anisotropically dry-etching said dielectric layer according to a high selectivity etching step.

25. The method of claim 22, wherein forming said metal silicide layer comprises forming a metal layer on at least the upper surface of the upper portion of said at least one intermediate polysilicon line and reacting at least partially the polysilicon and the metal at the polysilicon-metal interface into metal silicide by a thermal treatment.

26. The method of claim 25, wherein forming said metal layer comprises blanket-depositing said metal layer according to a sputtering process.

27. The method of claim 26, further comprising removing non-reacted metal after the thermal treatment by selective wet-etching.

28. The method of claim 22, wherein said dielectric layer comprises at least one of silicon oxide and silicon nitride.

29. The method of claim 22, wherein said at least one metal silicide layer comprises at least one of titanium, cobalt, tantalum, zirconium, tungsten, nickel and a combination thereof.

* * * * *

UNITED STATES PATENT AND TRADEMARK OFFICE
CERTIFICATE OF CORRECTION

PATENT NO. : 7,148,145 B2 Page 1 of 1
APPLICATION NO. : 10/400598
DATED : December 12, 2006
INVENTOR(S) : Karsten Wieczorek, Manfred Horstmann and Rolf Stephan It is certified that error appears in the above-identified patent and that said Letters Patent is hereby corrected as shown below:

Col. 9, line 29 (claim 12, line 29), change "suicide" to -- silicide --.

Signed and Sealed this

Twentieth Day of March, 2007

JON W. DUDAS
*Director of the United States Patent and Trademark Office*